(12) United States Patent  (10) Patent No.: US 8,330,154 B2
Wang et al.  (45) Date of Patent: *Dec. 11, 2012

(54) PIEZOELECTRIC AND SEMICONDUCTING COUPLED NANOGENERATORS

(75) Inventors: Zhong L. Wang, Marietta, GA (US); Jinhui Song, Atlanta, GA (US); Xudong Wang, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 1763 days.

This patent is subject to a terminal disclaimer.

(21) Appl. No.: 11/608,865

(22) Filed: Dec. 11, 2006

(65) Prior Publication Data

US 2010/0117488 A1   May 13, 2010

Related U.S. Application Data

(60) Provisional application No. 60/752,558, filed on Dec. 20, 2005, provisional application No. 60/759,637, filed on Jan. 18, 2006, provisional application No. 60/795,734, filed on Apr. 28, 2006, provisional application No. 60/796,442, filed on May 1, 2006.

(51) Int. Cl.
*H01L 27/20* (2006.01)

(52) U.S. Cl. ............................. 257/41; 257/43

(58) Field of Classification Search ............. 257/41–43, 257/E27.006; 977/701, 720, 721, 722, 724, 977/725, 730, 832, 837, 932, 948

See application file for complete search history.

(56) References Cited

U.S. PATENT DOCUMENTS

| | | | |
|---|---|---|---|
| 3,500,451 A | 3/1970 | Yando | |
| 6,559,550 B2 * | 5/2003 | Herman | 290/1 R |
| 7,839,028 B2 * | 11/2010 | Pinkerton | 310/10 |
| 8,003,982 B2 * | 8/2011 | Wang et al. | 257/43 |
| 8,039,834 B2 * | 10/2011 | Wang et al. | 257/43 |

(Continued)

FOREIGN PATENT DOCUMENTS

JP  51-33373  3/1976

(Continued)

OTHER PUBLICATIONS

Jeon et al., "MEMS power generator with transverse mode thin film PZT", Sensors and Actuators A: Physical, vol. 122, No. 1, p. 16-22, Jul. 29, 1005.*

(Continued)

*Primary Examiner* — Cuong Q Nguyen
(74) *Attorney, Agent, or Firm* — Bryan W. Bockhop; Bockhop & Associates, LLC

(57) ABSTRACT

An electrical generator includes a substrate, a semiconductor piezoelectric structure having a first end and an opposite second end disposed adjacent to the substrate, a first conductive contact and a second conductive contact. The structure bends when a force is applied adjacent to the first end, thereby causing an electrical potential difference to exist between a first side and a second side of the structure. The first conductive contact is in electrical communication with the first end and includes a material that creates a Schottky barrier between a portion of the first end of the structure and the first conductive contact. The first conductive contact is also disposed relative to the structure in a position so that the Schottky barrier is forward biased when the structure is deformed, thereby allowing current to flow from the first conductive contact into the first end.

25 Claims, 5 Drawing Sheets

U.S. PATENT DOCUMENTS

| | | | |
|---|---|---|---|
| 2003/0205657 A1 | 11/2003 | Voisin | |
| 2004/0127025 A1 | 7/2004 | Crocker, Jr. et al. | |
| 2005/0188751 A1 | 9/2005 | Puskas | |
| 2005/0242366 A1 | 11/2005 | Parikh et al. | |
| 2009/0309456 A1* | 12/2009 | Stollberg | 310/319 |
| 2010/0033059 A1* | 2/2010 | Choi et al. | 310/339 |
| 2010/0066208 A1* | 3/2010 | Choi et al. | 310/339 |
| 2010/0139750 A1* | 6/2010 | Kim et al. | 136/255 |
| 2010/0141095 A1* | 6/2010 | Park | 310/339 |
| 2010/0253184 A1* | 10/2010 | Choi et al. | 310/339 |

FOREIGN PATENT DOCUMENTS

| | | |
|---|---|---|
| JP | 09-233861 | 5/1997 |
| JP | 2003-073859 | 12/2003 |
| JP | 2005-237156 | 2/2005 |
| WO | 2005/006346 A2 | 1/2005 |

OTHER PUBLICATIONS

Gao et al., Nanoarchitectures of semiconducting and piezoelectric zinc oxide, J. Applied Physics 97, 044304 (2005).

Wang et al., "Large-Size Liftable Inverted-Nanobowl Sheets as Reusable Masks for Nanolithography," Nano Letters, vol. 5, No. 9, 2005, 1748-1788.

Lao et al., "Formation of double-side teethed nanocombs of ZnO and self-catalysis of Zn-terminated polar surface," Chemical Physics Letters, Elsevier B.V., 2005.

Lao et al., "Formation of double-side teethed nanocombs of ZnO and self-calalysis of Zn-terminated polar surface," Chemical Physics Letters (Science Direct), (Abstract), 2007.

Wang et al., "Large-Size Liftable Inverted-Nanobowl Sheets as REusable Masks for Nanolithography," Nano Letters, vol. 5, (Abstract), 2005.

Wang et al., "Piezoelectric Nanogenerators Based on Zinc Oxide Nanowire Arrays," Science, vol. 312, pp. 242-245, Apr. 14, 2006.

Peck-Radosavjevic et al., "Thrombopoietin induces rapid resolution of thrombocytopenia after orthotopic liver transplantation through increased platelet production," Blood, vol. 95, No. 3, (2000).

\* cited by examiner

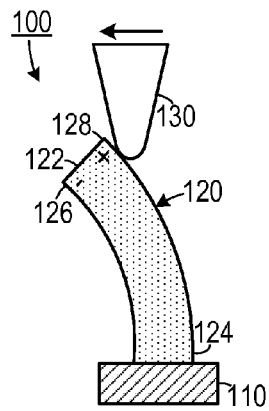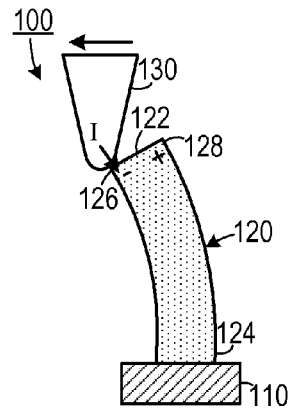
FIG. 1A    FIG. 1B
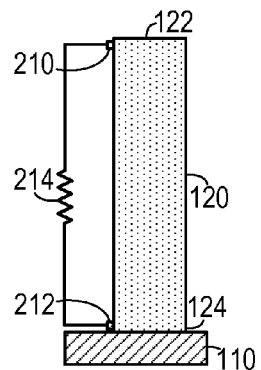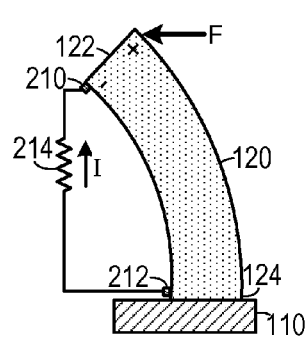
FIG. 2A    FIG. 2B
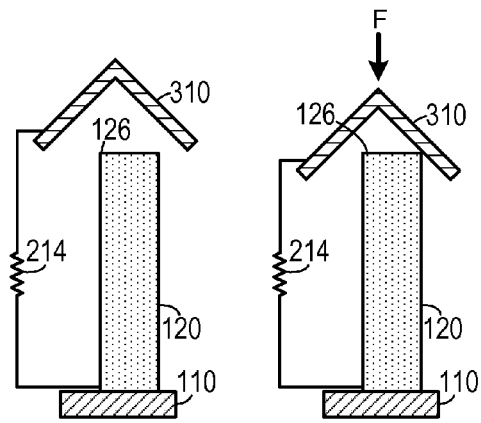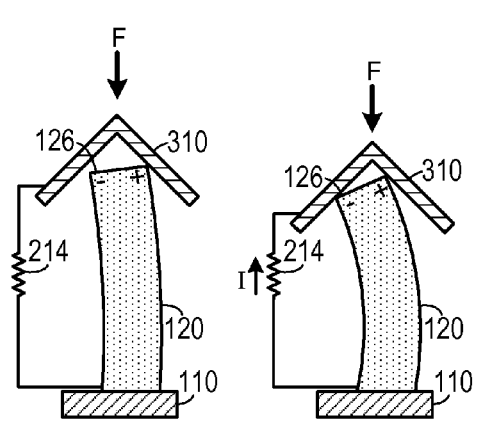
FIG. 3A    FIG. 3B    FIG. 3C    FIG. 3D

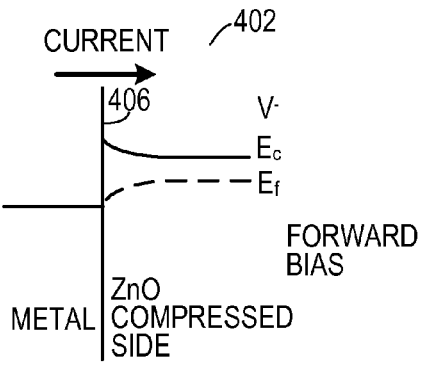
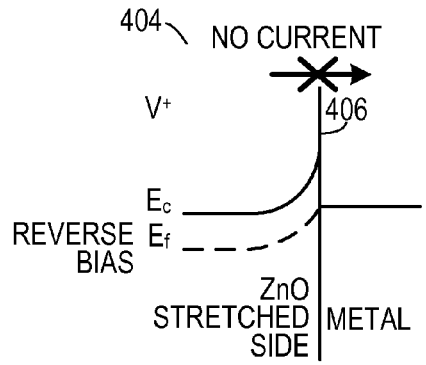
FIG. 4A
FIG. 4B
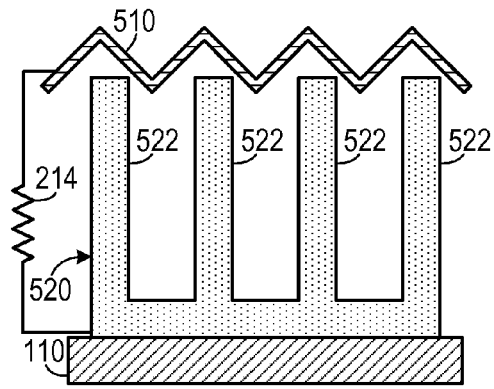
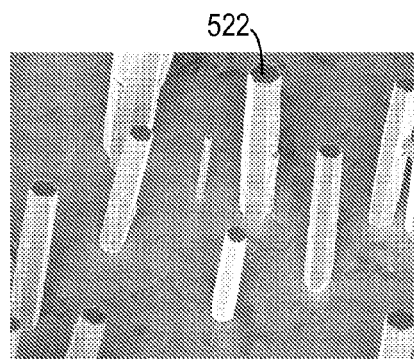
FIG. 5A
FIG. 5B
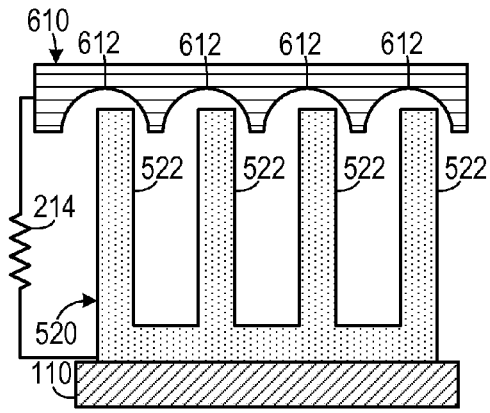
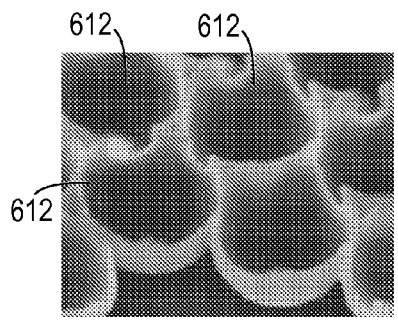
FIG. 6A
FIG. 6B

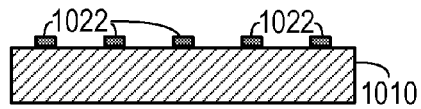
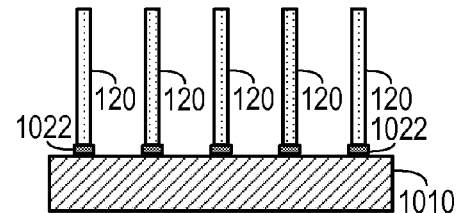
FIG. 10A  FIG. 10B
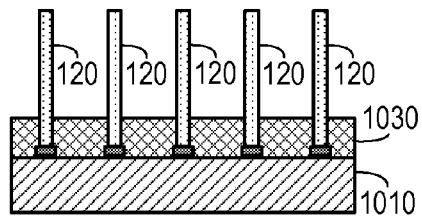
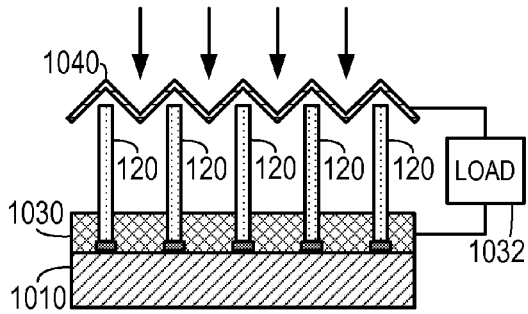
FIG. 10C  FIG. 10D
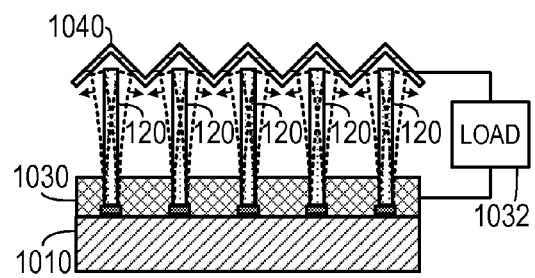
FIG. 11

PIEZOELECTRIC AND SEMICONDUCTING COUPLED NANOGENERATORS

CROSS-REFERENCE TO RELATED APPLICATION(S)

This application claims the benefit of U.S. Provisional Patent Applications: Ser. No. 60/752,558, filed Dec. 20, 2005; Ser. No. 60/759,637, filed on Jan. 18, 2006; Ser. No. 60/795,734, filed Apr. 28, 2006; and Ser. No. 60/796,442, filed May 1, 2006, the entirety of each of which is hereby incorporated herein by reference.

STATEMENT OF GOVERNMENT INTEREST

This invention was made with support from the U.S. government under grant number Cooperative Agreement No. NCC3-982 awarded by NASA/Glenn Research Center and Contract No. DMR-9733160 awarded by the National Science Foundation. The government may have certain rights in the invention.

BACKGROUND OF THE INVENTION

1. Field of the Invention

The present invention relates to electrical generators and, more specifically, to an electrical generator that employs a piezoelectric semiconducting structure to convert mechanical energy into electrical energy.

2. Description of the Prior Art

A Schottky barrier is a metal-semiconductor junction that rectifies current and, thus, may be used as a diode. A metal-semiconductor junction that does not rectify current is called an Ohmic contact. The rectifying properties of a metal-semiconductor junction depend on the metal's work function, the band gap of the intrinsic semiconductor, and the type and concentration of dopants in the semiconductor.

A piezoelectric material is one that forms an electrical potential difference between two regions of the material when the material is subjected to uneven mechanical forces. For example, when certain piezoelectric materials are bent, they develop a positive voltage in one region and a negative voltage in another region.

Many micro-scale and nano-scale machines have been proposed for such uses as in vitro medical devices. However, most of these machines are limited by the size of the power source that drives them. Specifically, many such designs rely on chemical batteries to supply electrical power to the devices. Therefore, they can be no smaller than the battery used and are useful only so long as the battery is able to provide power.

However, some of such devices need to be operational for long periods, rather than be limited by the lifespan of a battery. Also, it may be extremely difficult to change the batteries in some devices, such as environmental sensors.

Therefore, there is a need for electrical generators that are capable of providing power for long periods and that are driven by environmentally-available mechanical energy.

SUMMARY OF THE INVENTION

The disadvantages of the prior art are overcome by the present invention which, in one aspect, is an electrical generator that includes a first substrate, a semiconductor piezoelectric structure, a first conductive contact and a second conductive contact. The semiconductor piezoelectric structure has a first end and an opposite second end. The second end is disposed adjacent to the first substrate. The structure has a flexibility so that the structure bends when a force is applied adjacent to the first end, thereby causing an electrical potential difference to exist between a first side of the semiconductor piezoelectric structure and a second side of the semiconductor piezoelectric structure at a portion of the first end. The first conductive contact is disposed so as to be in electrical communication with the first end and consists essentially of a material that creates a Schottky barrier between a portion of the first end of the structure and the first conductive contact. The first conductive contact is also disposed relative to the structure in a position so that the Schottky barrier is forward biased when the structure is deformed thereby allowing current to flow from the first conductive contact into the first end. The second conductive contact is disposed so as to be in electrical communication with the second end.

In another aspect, the invention is a method of making an electrical generator, in which a semiconductor piezoelectric structure is grown from a first substrate. A first conductive contact is placed in a position relative to the semiconductor piezoelectric structure so that when the semiconductor piezoelectric structure bends, the first conductive contact becomes in electrical communication with a portion of the semiconductor piezoelectric structure so as to form a forward-biased Schottky barrier therebetween.

In yet another aspect, the invention is a method of making a sheet electrical generator, in which a plurality of semiconductor piezoelectric structures are grown upwardly from a conductive substrate. A first deformable insulating layer is deposited onto the substrate to a level so that the deformable insulating layer surrounds each of the plurality of semiconductor piezoelectric structures to a predetermined level. A conductive layer is deposited on top of the deformable insulating layer so that the conductive layer is in electrical communication with each of the plurality of semiconductor piezoelectric structures.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

BRIEF DESCRIPTION OF THE FIGURES OF THE DRAWINGS

FIGS. 1A-1B are schematic diagrams of a first embodiment.

FIGS. 2A-2B are schematic diagrams of a second embodiment.

FIGS. 3A-3D are schematic diagrams of a third embodiment.

FIG. 4A is an energy band gap diagram showing the relative energy bands in a forward-biased device.

FIG. 4B is an energy band gap diagram showing the relative energy bands in a reverse-biased device.

FIG. 5A is a schematic diagram of one embodiment.

FIG. 5B is a micrograph of a plurality of nanostructures of a type that may be employed in the embodiment shown in FIG. 5A.

FIG. 6A is a schematic diagram of an embodiment employing nano-bowls.

FIG. 6B is a micrograph of a plurality of nano-bowls of a type that may be employed in the embodiment shown in FIG. 6A.

FIGS. 10A-10D are a series of schematic diagrams that demonstrate a method of making a sheet embodiment.

FIG. 11 is a schematic diagram showing operation of an embodiment in response to acoustic wave energy.

DETAILED DESCRIPTION OF THE INVENTION

Figure 7:
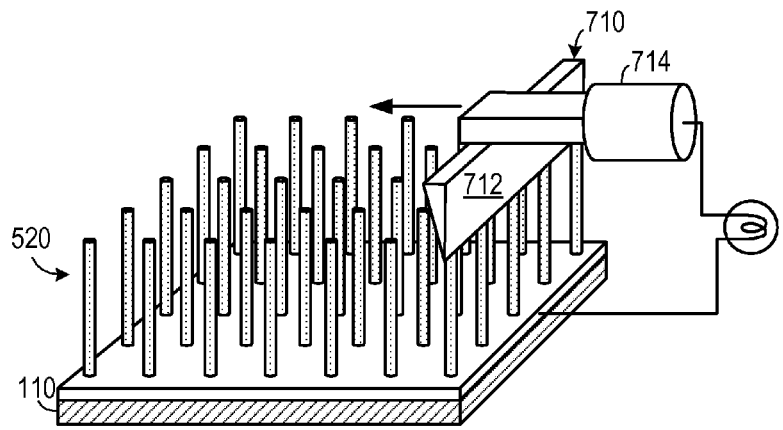
FIG. 7 is a schematic diagram of an embodiment that employs a reciprocating blade.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

As shown in FIGS. 1A-1D, in one embodiment of a generator 100, a semiconductor piezoelectric structure 120, having a first end 122 and an opposite second end 124, extends from a substrate 100. The semiconductor piezoelectric structure 120 could include a nanostructure, such as a nano-wire, a nano-rod, a nano-belt or a nano-tube. One representative nanostructure could include a zinc oxide structure, as a zinc oxide crystal exhibits both the property of being piezoelectric and of acting as a semiconductor.

When a conductive contact 130, e.g., a probe tip of an atomic force microscope, applies a force in the direction of the arrow, the semiconductor piezoelectric structure 120 bends, thereby creating a potential difference is created between a first side 126 (which is on the compressed side of the semiconductor piezoelectric structure 120) and a second side 128 (which is on the decompressed side). When the conductive contact 130 touches the second side 128, which has a positive potential relative to the first side 126, a reverse-biased Schottky barrier is formed between the conductive contact 130 and the second side 128. Because the Schottky barrier is reverse-biased, no current flows between the conductive contact 130 and the semiconductor piezoelectric structure 120. However, as the conductive contact moves across the semiconductor piezoelectric structure 120 and reaches the first side 126 (which has a negative potential relative to the second side 128), the Schottky barrier between the conductive contact 130 and the semiconductor piezoelectric structure 120 becomes forward-biased and current is allowed to flow through the Schottky barrier.

Zinc oxide (ZnO) exhibits both semiconducting and piezoelectric properties. One embodiment of an electric generator employs aligned ZnO nano-wire arrays for converting nano-scale mechanical energy into electric energy. The operating mechanism of the electric generator relies on the coupling of piezoelectric and semiconducting dual properties of ZnO as well as the rectifying function of the Schottky barrier formed between the metal tip 130 and the nano-wire 120. This approach has the potential of converting biological mechanical energy, acoustic or ultrasonic vibration energy, and biofluid hydraulic energy into electricity, which may result in self-powering of wireless nanodevices and nanosystems. These embodiments employ nano-wires (NWs) and nano-belts (NBs), including wurtzite structured materials (such as ZnO, GaN and ZnS) to create self-powering devices and systems (which could be built at the nanoscale).

One experimental embodiment employed mechanical manipulation of a single ZnO wire/belt 120 by a probe 130 coupled to an atomic force microscope (AFM). By selecting a long ZnO wire/belt 120 that was large enough to be seen under an optical microscope, one end of the ZnO wire was affixed on a silicon substrate by silver paste, while the other end was left free. The substrate was an intrinsic silicon, therefore its conductivity was relatively low. The wire 120 was laid horizontally on the substrate 110 (however, it was spaced apart from the substrate by a small distance to eliminate friction, except at the affixed end). The measurements were performed by an AFM using a Silicon tip coated with Platinum film, which had a tetrahedral shape with an apex angle of 70°, was 14 μm in height, and had a spring constant of 1.42 N/m. The measurements were done in AFM contact mode under a constant normal force of 5 nN between the tip and the sample surface with a scan area of 70×70 μm$^2$.

Both the topography (feed back signal from the scanner) and the corresponding output voltage (V) images across a load were recorded simultaneously when the AFM tip was scanned across a wire or a belt. The topography image reflected the change in normal force perpendicular to the substrate, which showed a bump only when the tip scans over the wire. The output voltage between the conductive tip and the ground was continuously monitored as the tip scanned over the wire or the belt. No external voltage was applied in any stage of the experiment.

The AFM tip 130 was scanned line-by-line at a speed of 105.57 μm/s perpendicular to the wire either from above the top end to the lower part of the wire or from the lower part towards the top end. For a wire with a hexagonal cross-section, three characteristic features were observed. When the tip scanned above the top end of the wire without touching the wire, the output voltage signal was nothing but noise. When the tip scanned until it touched the top end of the wire, a spark output voltage signal was observed. The output voltage is negative for the load $R_L$, for almost all of the observed cases, indicating the tip has a lower potential than the grounded silver paste. When the tip 130 scanned down along the wire 120, it deflected the wire but could not go over it, and the output voltage showed no peak but noise.

When subjected to a displacement force, one side of the nano-wire 120 was stretched, and the other side was compressed. The observed results are summarized as follows: First, piezoelectric discharge was observed for both wire and belt, and it occurred only when the AFM tip touched the end of the bent wire/belt. Second, the piezoelectric discharge occurred only when the AFM tip touched the compressed side of the wire/belt, and there was no voltage output if the tip touched the stretched side of the wire/belt. Third, the piezoelectric discharge gives negative output voltage as measured from the load $R_L$. Finally, while viewing a topography image, it was noticed that the voltage output event occurred when the AFM tip was about finished crossing the width of the wire/ belt 120, which means that the discharge event was delayed to the last half of the contact between the tip 130 and the wire/belt 120.

In order to explain the observed phenomena, we now examine the potential distribution in the wire/belt 120 based on piezoelectric induced potential distribution. We simply consider the polarization introduced in a belt as a result of elastic deformation. The relationship between strain ($\epsilon$) and the local piezo-electric field (E) is given by $\epsilon$=dE, where d is the piezoelectric coefficient. For a belt of thickness T and length L under the displacement of an external force F from the AFM tip applied perpendicularly at the top of the belt (z=L), a strain field in the belt would be formed. For any segment of the belt along its length, the local bending is described by its local curvature 1/R, R is the local radius for describing the bending of the belt, which is related to the shape of the belt by:

$$\frac{1}{R} = \frac{d^2 y}{dz^2}$$

which was from the geometrical shape of the curved belt. The shape of the belt can be described by the static deflection equation of the belt:

$$\frac{d^2 y}{dz^2} = \frac{F \cdot (L-z)}{YI}$$

where Y is the elastic modulus of the belt and I is its momentum of inertia. The local strain in the belt is given by $\epsilon$=y/R, and the corresponding electric field along the z-axis is given by:

$$E_z = \frac{\varepsilon}{d} = \frac{y}{d \cdot R}$$

This is the electric field that dominates the potential distribution under small bending approximation and the ignorance of the electric field effect on local strain via the piezoelectric effect. For simplicity, we consider the potential at the two side surfaces y=±T/2 by integrating the electric field along the entire length of the belt:

$$V^{\pm} = \int E \cdot ds = \pm \int \frac{T}{2d} \cdot \frac{1}{R} \cdot ds = \pm \frac{T}{2d} \cdot \int d\theta = \pm \frac{a}{d} \cdot \theta_{max}$$

where $\theta_{max}$ is the maximum deflection angle at the top of the wire. Since:

$$V^{\pm} = \pm \frac{TFL^2}{4dYI}$$

Using the relationship between the maximum deflection $y_m$ and the applied force:

$$F = \frac{3YIy_m}{L^3}$$

we have the potential induced by piezoelectric effect at the stretched and compressed side surfaces, respectively, being:

$$V^{\pm} = \pm 3Ty_m / 4Ld$$

Examining the contact between the AFM conductive tip with the stretched and compressed side surfaces of the belt shows that the compressed side of the semiconductor ZnO wire/belt 120 has negative potential V⁻ and the stretched side has positive potential (V⁺). This is the cause of the two distinct transport processes across the Schottky barrier at the interface, as described below. When the tip contacts the stretched side surface, the Pt metal tip has a potential of nearly zero, $V_m$=0, the metal tip-belt interface is negatively biased for $\Delta V = V_m - V^+ < 0$. With consideration the n-type semiconductor characteristic of the as-synthesized ZnO belt, the Pt metal-ZnO semiconductor (M-S) interface in this case is a reversely biased Schottky diode, resulting in little current flowing across the interface. In this case, the piezoelectric static charges, mainly due to $Zn^{2+}$ and $O^{2-}$ ions, are accumulated and preserved, but without creating a current flow through the belt. This is a key process that prevents the slow "leakage" of the current as the deformation is being built up by the tip, otherwise, no observable output electric signal in the next step. As the tip continues to scan and touches the compressed side of the belt, the metal tip-belt interface is positively biased for $\Delta V = V_L = V_m - V > 0$. The interface is thus a positively biased Schottky diode, and it is possible to have current flow from the tip through the belt 120. The flow of electrons is to neutralize the piezoelectric ionic charges distributed in volume, resulting in a sudden increase in the output electric current. The output voltage measured on the load is negative in reference to the grounded root of the belt with consideration the flowing direction of the current.

The elastic deformation energy as created by the displacement force F is mainly dissipated in three ways: creating mechanical resonance/vibration after releasing the belt 120, generating piezoelectric discharge energy for each cycle of the vibration, and overcoming the friction and viscosity, if any, from the environmental and substrate. The mechanical resonance of the belt 120 may continue for many cycles, but it is eventually damped by the viscosity of the medium. The piezoelectric voltage output is generated in each cycle of the vibration, but the AFM tip 130 in the experimental design may be too slow to collect the electric signal output from each cycle of the belt vibration. It was found that the discharge signal can sometimes be collected for an extensive period of time, during which the belt may have resonated for over 10 cycles, producing a continuous and constant output DC voltage. As the resonance frequency of the wire was about 10 KHz, and the scanning speed of the tip was about 10 µm/s, it is feasible that the wire 120 had contacted the AFM probe tip 130 over 100 times before it departed to the point that it was too far away to make contact. It was observed that a piezoelectric output voltage is created in each cycle of vibration. Thus a DC power source can be created by continuously collecting the output voltage.

There is current flow only when the AFM tip 130 is in contact with the compressed side of the belt/wire. If the AFM probe tip 130 contacts the stretched side 128, no output current is possible even under extremely large elastic deformation. This expected result was observed where a ZnO wire was subjected to a large deformation, but no output voltage was received.

By deflecting a wire/belt 120 using a conductive AFM tip 130 in contact mode, the energy was first created by the deflection force and stored by piezoelectric potential, and later converted into piezo-electric energy. The mechanism of the generator is the result of coupled semiconducting and piezoelectric properties of ZnO. The piezoelectric effect is required to create electric potential of ionic charges from elastic deformation; the semiconducting property is required to preserve the charges and then release the potential via the rectifying behavior of the Schottky barrier at the metal-ZnO interface, which serves as a switch in the entire process. The good conductivity of ZnO makes current flow possible. This process may also be possible for wurtzite structured materials such as GaN and ZnS.

A second embodiment of a generator is shown in FIGS. 2A and 2B, in which a first conductive contact 210 is disposed at the first end 122 and a second conductive contact 212 is disposed at the second end 124. The second conductive contact 212 could be either placed against the semiconductor piezoelectric structure 120 or placed against the substrate 110 if the substrate 110 is made of a conductive material. A load 214 is coupled between the first conductive contact 210 and the second conductive contact 212 so that when a force is applied to the first end 122 in direction F, a current I flows through the load 214.

A third embodiment is shown in FIGS. 3A-3D. In this embodiment, the first conductive contact 310 has an uneven surface. As a downward force is applied to the first conductive contact 310, as shown in FIG. 3B, part of the semiconductor piezoelectric structure 120 makes contact with the first conductive contact 310. This causes the semiconductor piezoelectric structure 120 to bend and a potential difference forms between the two sides of the semiconductor piezoelectric structure 120. Initially, as shown in FIG. 3C, only the positive side of the semiconductor piezoelectric structure 120 is in contact with the first conductive contact 310, which creates a reverse-biased Schottky barrier through which no current flows. However, once the first conductive contact 310 has been pushed down far enough, the negative side of the semiconductor piezoelectric structure 120 makes contact with the first conductive contact 310, thereby forming a forward-biased Schottky barrier and allowing current to flow through the load 214. The fact that the positive side of the semiconductor piezoelectric structure 120 may still be touching the first conductive contact 310 makes no difference since the Schottky barrier between the positive side and the first conductive contact 310 is still reverse-biased and, therefore, no current will flow through the positive side.

The device in the forward-biased state has an energy band gap diagram 402 as shown in FIG. 4A, in which the conduction energy level ($E_c$) of the compressed side of the semiconductor piezoelectric structure (which is ZnO in the example presented) is greater than the Fermi energy ($E_f$) of the metal. Given that a negative potential ($V^-$) exists between the metal and the compressed side, current is able to flow from the metal to the semiconductor piezoelectric structure (using the convention that current represents the flow of charge from positive to negative) across the Schottky barrier 406. When the metal is in contact with the stretched side of the semiconductor piezoelectric structure, as shown in FIG. 4B, the conduction energy level ($E_c$) of the compressed side is not greater than the Fermi energy ($E_f$) of the metal and, since the stretched side has a positive potential relative to the potential of the metal, current is not allowed to flow across the Schottky barrier 406.

One embodiment, as shown in FIG. 5A, employs an array 520 of zinc oxide (ZnO) nanostructures 522 with a corrugated conductor 510 placed above the nanostructures 522. A load 214 is coupled to the base of the nanostructure array 520 (forming an Ohmic contact therebetween) and to the corrugated conductor 510. A micrograph of suitable ZnO nanostructures 522 is shown in FIG. 5B. In an alternate embodiment, as shown in FIG. 6A, a sheet 610 defining a plurality of nano-bowls 612 is used as the conductive contact. A micrograph of a plurality of nano-bowls 612 is shown in FIG. 6A. Suitable nano-bowls may be fabricated according to a method disclosed in detail in U.S. Patent Application Publication No. US-2005-0224779-A1 (Ser. No. 11/010,178, filed on Dec. 10, 2004), the entirety of which is incorporated by reference herein. This embodiment could be employed in generating electricity from body movement. For example, this embodiment could be applied to the soles of a pair of shoes to generated electricity while the person wearing the shoes walks.

An embodiment that employs an array of nano-wires 520 that are activated by a reciprocating contact 710 is shown in FIG. 7. The reciprocating contact 710 includes a metal contact blade 712 that is driven by an actuator 714, such as a piston-type actuator.

Figure 8A:
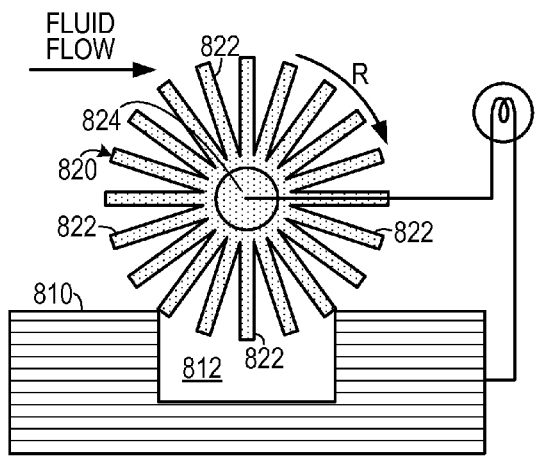
FIG. 8A is a schematic diagram of a rotational embodiment.
Figure 8B:
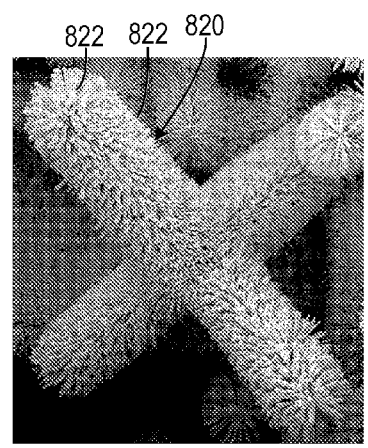
FIG. 8B is a micrograph of radially-disposed nanostructures of a type that may be employed in the embodiment shown in FIG. 8A.

A rotating generator is shown in FIG. 8A, in which a semiconductor piezoelectric structure 820 includes a plurality of nanorods 822 extending radially from a core 824 and that is capable of rotating about an axis in rotational direction R. The conductive contact 810 defines an opening 812 that is disposed so that as the nanorods 822 are drawn against edges of the contact 810 as the semiconductor piezoelectric structure 820 rotates. In this embodiment, flowing fluid can cause the semiconductor piezoelectric structure 820 to rotate much in the way that a windmill rotates. This embodiment could be used as a generator within fluid flow structures, such as a blood vessel or a water pipe.

Figure 9A:
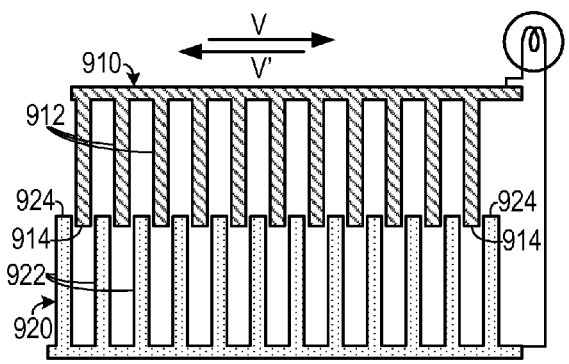
FIG. 9A is a schematic diagram of an embodiment employing two sets of nano-wires.
Figure 9B:
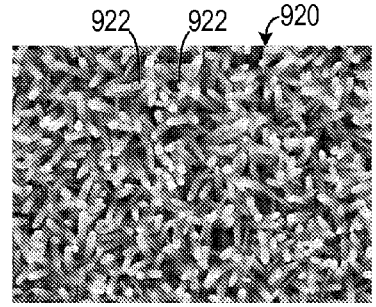
FIG. 9B is a micrograph of a plurality of nano-wires of a type that may be employed in the embodiment shown in FIG. 9A.

An embodiment for converting vibrational energy into electrical energy is shown in FIG. 9A, in which an array 920 of semiconductor piezoelectric nanostructures 922 is placed in an opposing relationship to an array 910 of conductive nanorods 912. A first end 924 of at least some of the semiconductor piezoelectric nanorods 922 is adjacent to a first end 914 of at least some of a set of the conductive nanorods so that as the conductive nanorods 912 vibrate laterally (in directions V and V') with respect to the semiconductor piezoelectric nanorods 922, a forward-biased Schottky barrier is formed by contact of at least one of the conductive nanorods 912 and at least one of the semiconductor piezoelectric nanorods 922, thereby generating an electrical current. A micrograph of an array 920 of semiconductor piezoelectric nanorods 922 is shown in FIG. 9B.

In one method of making a generator, as shown in FIGS. 10A through 10D, a plurality of catalyst particles 1022 (such as gold particles) is placed on a substrate 1010. Zinc oxide nano-wires 120 are then grown from the catalyst particles 1022 using a process of the type disclosed in U.S. Patent Application Publication No. US-2005-0224779-A1. A deformable layer 1030, such as a layer of an organic polymer, is deposited onto the substrate 1010 to a level so that the deformable layer 1030 surrounds each of the plurality of zinc oxide semiconductor piezoelectric structures 120 to a predetermined level. An uneven conductive contact layer 1040 is placed above the nano-wires 120 so that as a downward force (in the direction of the arrows) is applied to the conductive contact layer 1040, forward-biased Schottky barriers are formed (in the manner discussed with reference to FIGS. 3A-3D) and a current is applied to the load 1032. In this embodiment, the deformable layer 1030, maintains the attitude of the nano-wires 120, keeps them separated and prevents them from peeling off of the substrate 1010.

This embodiment may be subjected to extremely large deformation, so that they can be used for flexible electronics as a flexible or foldable power source. One reason for choosing zinc oxide in this embodiment is that it is a biocompatible and bio-safe material and, thus, it has a potential for being implanted as a power source in the human body. The flexibility of the polymer substrate used for growing zinc oxide nano-wires makes it feasible to accommodate the flexibility of human muscles so that it can use mechanical energy (body movement, muscle stretching) in the human body to generate electricity.

The embodiment shown in FIGS. 10A-10D may also respond to acoustic wave or ultrasonic wave energy, as shown in FIG. 11. Resonance of the nano-wires 120 as a one-end free beam can also generate electricity.

The principles and technology demonstrated here have the potential of converting mechanical movement energy (such as body movement, muscle stretching, blood pressure), vibration energy (such as acoustic/ultrasonic wave), and hydraulic energy (such as flow of body fluid, blood flow, contraction of blood vessel, dynamic fluid in nature) into electric energy that may be sufficient for self-powering nanodevices and nano-systems. The technology could have important applications in wireless self-powered nanodevices by harvesting energy from the environment. It may also provide a method for indirectly charging of a battery. It may be possible to fabricate large-power output electric generator by using arrays of ZnO wires/belts, which can be grown on substrates such as metal foils, flexible organic plastic substrates, ceramic substrates (such as alumina) and compound semiconductors (such as GaN and AlN). The nano-generator could be the basis for using self-powering technology for in-situ, real-time and implantable biosensing, biomedical monitoring and biodetection. It could have the potential of solving key energy requirement for remote sensing and actuating.

Figures 12, 13:
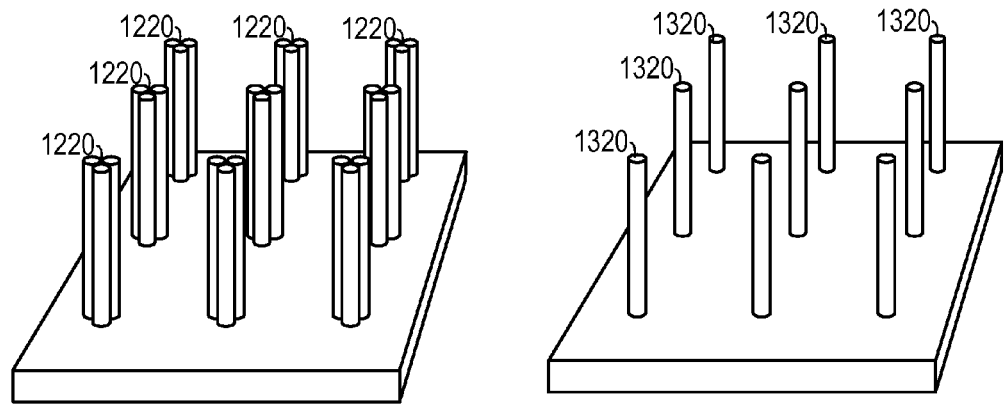
FIG. 12 is a top perspective view of a first patterned nanostructure embodiment.
FIG. 13 is a top perspective view of a second patterned nanostructure embodiment.
Figure 14:
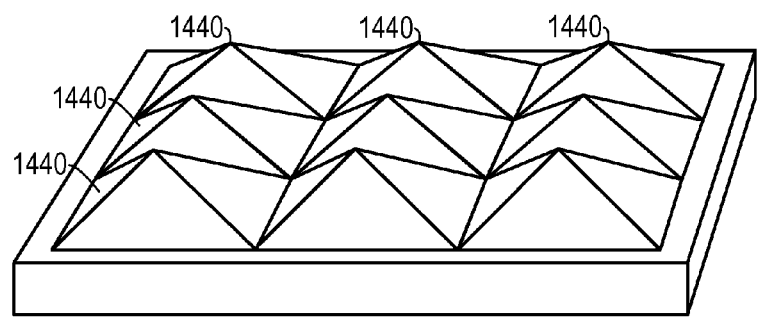
FIG. 14 is a top perspective view of a pyramidal conductive contact embodiment.

In one embodiment, as shown in FIG. 12, the nanostructures could be patterned in clusters 1220 or, as shown in FIG. 13, individual nanostructures 1320 arranged in a pattern. In one embodiment, as shown in FIG. 14, the conductive contact could include an array of conductive pyramids 1440.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. An electrical generator, comprising:
   a. a first substrate;
   b. a semiconductor piezoelectric structure having a first end and an opposite second end, the second end disposed adjacent to the first substrate, the structure having a flexibility so that the structure bends when a force is applied adjacent to the first end, thereby causing an electrical potential difference to exist between a first side of the semiconductor piezoelectric structure and a second side of the semiconductor piezoelectric structure at a portion of the first end;
   c. a first conductive contact disposed so as to be in electrical communication with the first end, the first conductive contact consisting essentially of a material that creates a Schottky barrier between a portion of the first end of the structure and the first conductive contact, the first conductive contact also disposed relative to the structure in a position so that the Schottky barrier is forward biased when the structure is deformed thereby allowing current to flow from the first conductive contact into the first end; and
   d. a second conductive contact disposed so as to be in electrical communication with the second end.

2. The electrical generator of claim 1, further comprising a circuit element that is electrically coupled to both the first conductive contact and the second conductive contact.

3. The electrical generator of claim 1, wherein the structure comprises a nano-structure.

4. The electrical generator of claim 1, wherein the structure is mono-crystalline.

5. The electrical generator of claim 3, wherein the nano-structure comprises a nano-rod.

6. The electrical generator of claim 3, wherein the nano-structure comprises a nano-wire.

7. The electrical generator of claim 3, wherein the nano-structure comprises a nano-tube.

8. The electrical generator of claim 3, wherein the nano-structure comprises a nano-ribbon.

9. The electrical generator of claim 3, wherein the nano-structure comprises a nano-belt.

10. The electrical generator of claim 1, wherein the semiconductor piezoelectric structure comprises zinc oxide.

11. The electrical generator of claim 1, wherein the first conductive contact comprises a metal.

12. The electrical generator of claim 1, wherein the semiconductor piezoelectric structure comprises a plurality of nanorods extending upwardly from the first substrate and wherein the first conductive contact comprises an uneven surface disposed parallel to and spaced apart from the first substrate.

13. The electrical generator of claim 12, wherein the uneven surface defines a plurality of corrugations.

14. The electrical generator of claim 12, wherein the uneven surface defines a plurality of nano-bowls that are directed toward the first substrate.

15. The electrical generator of claim 1, wherein the semiconductor piezoelectric structure comprises a plurality of nanorods extending upwardly from the first substrate and wherein the first conductive contact comprises:
   a. a conductive blade having an edge that is parallel to the first substrate and transverse to the nanorods; and
   b. a mechanism that moves the blade across the plurality of nanorods so as to cause at set of the nanorods to bend and so as to make contact with an end of each of the set of nanorods thereby forming a forward-biased Schottky barrier therebetween.

16. The electrical generator of claim 1, wherein the semiconductor piezoelectric structure comprises a plurality of nanorods extending radially from a core that is capable of rotating about an axis.

17. The electrical generator of claim 16, wherein the first conductive contact is spaced apart from the core in a fixed relationship so that the first end of each of the nanorods moves into contact with the first conductive contact so as to form a forward-biased Schottky barrier as the core rotates.

18. The electrical generator of claim 1, wherein the semiconductor piezoelectric structure comprises a plurality of semiconductor piezoelectric nanorods extending upwardly from the first substrate and wherein the first conductive contact comprises a plurality of conductive nanorods extending downwardly from a second substrate and disposed so that a first end of each of a set of the semiconductor piezoelectric nanorods is adjacent to a first end of each of a set of the conductive nanorods so that as the conductive nanorods vibrate laterally with respect to the semiconductor piezoelectric nanorods, a forward-biased Schottky barrier is formed by contact of at least one conductive nanorod and at least one semiconductor piezoelectric nanorod.

19. The electrical generator of claim 1, wherein the semiconductor piezoelectric structure comprises a plurality of nanorods extending upwardly from the first substrate and wherein the first conductive contact comprises a conductive layer spaced apart from the substrate and in contact with a set of the plurality of nanorods.

20. The electrical generator of claim 19, further comprising a deformable insulating layer disposed between the substrate and the conductive layer.

21. The electrical generator of claim 20, wherein the deformable insulating layer comprises a material that is sufficiently plastic as to allow the nanorods to bend when a predetermined force is applied to the electrical generator.

22. The electrical generator of claim 20, wherein the deformable insulating layer comprises an organic compound.

23. The electrical generator of claim 20, wherein the conductive layer comprises a metal.

24. The electrical generator of claim 23, wherein the metal comprises gold.

25. The electrical generator of claim 20, wherein the conductive layer comprises a polymer.

\* \* \* \* \*